US007718461B2

(12) United States Patent
Weller et al.

(10) Patent No.: US 7,718,461 B2
(45) Date of Patent: May 18, 2010

(54) NANOMETER-SCALE ELECTROMECHANICAL SWITCH AND FABRICATION PROCESS

(75) Inventors: Thomas Weller, Lutz, FL (US); Thomas Ketterl, Tampa, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 12/266,845

(22) Filed: Nov. 7, 2008

(65) Prior Publication Data

US 2010/0087063 A1 Apr. 8, 2010

Related U.S. Application Data

(62) Division of application No. 11/561,952, filed on Nov. 21, 2006, now Pat. No. 7,463,123.

(60) Provisional application No. 60/738,800, filed on Nov. 22, 2005.

(51) Int. Cl.
*H01L 21/00* (2006.01)

(52) U.S. Cl. ........................... 438/59; 438/52; 333/105; 333/262

(58) Field of Classification Search .................. 438/50, 438/52, 57, 59
See application file for complete search history.

(56) References Cited

U.S. PATENT DOCUMENTS

| | | | | |
|---|---|---|---|---|
| 4,931,753 | A | 6/1990 | Nelson et al. | |
| 6,621,387 | B1 * | 9/2003 | Hopcroft | 333/262 |
| 6,639,488 | B2 | 10/2003 | Deligianni et al. | |
| 6,698,082 | B2 | 3/2004 | Crenshaw et al. | |
| 6,764,872 | B2 * | 7/2004 | Lin et al. | 438/57 |
| 7,215,229 | B2 * | 5/2007 | Shen et al. | 335/78 |
| 2002/0153236 | A1 * | 10/2002 | Song et al. | 200/181 |

* cited by examiner

*Primary Examiner*—Charles D Garber
*Assistant Examiner*—Bryan R Junge
(74) *Attorney, Agent, or Firm*—Molly L. Sauter; Smith & Hopen, P.A.

(57) ABSTRACT

The present invention describes nano-scale fabrication technique used to create a sub-micron wide gap across the center conductor of a coplanar waveguide transmission line configured in a fixed-fixed beam arrangement, resulting in a pair of opposing cantilever beams that comprise an electro-mechanical switch. Accordingly, a nanometer-scale mechanical switch with very high switching speed and low actuation voltage has been developed. This switch is intended primarily for application in the RF/microwave/wireless industry.

10 Claims, 8 Drawing Sheets

FIB Switch 2 - Closed with No Bias

NANOMETER-SCALE ELECTROMECHANICAL SWITCH AND FABRICATION PROCESS

CROSS-REFERENCE TO RELATED APPLICATIONS

This disclosure is a divisional application claiming the benefit of the filing date of pending U.S. Nonprovisional patent application Ser. No. 11/561,952 filed by the same inventors on Nov. 21, 2006, which claims priority to expired U.S. Provisional Patent Application No. 60/738,800 filed Nov. 22, 2005.

STATEMENT OF GOVERNMENT INTEREST

This invention was made with Government support under Grant No. DASG60-99-0009 awarded by Department of the Army, Space and Missile Defense Command. The government has certain rights in the invention.

BACKGROUND OF THE INVENTION

Micro-electro-mechanical-systems (MEMS) technology has shown tremendous growth in recent years. Significant advances have also been made in the fabrication of MEMS devices for application in RF and microwave frequencies. Switching circuits utilizing this technology have been extensively studied since they are an important component in many RF and wireless systems. RF MEMS switches have already shown superior electrical performance to solid state p-i-n and FET switches at high frequencies. Due to these qualities, as well as their small size and their manufacturability using well characterized semiconductor processing techniques, RF MEMS switches have the potential to be a viable replacement to their solid state switch counterparts.

However, p-i-n diode and FET switches still outperform MEMS switches in switching speed and actuation voltage level. Solid state switches can switch between states in nanoseconds with very low voltage levels; generally at TTL levels. The fastest MEMS switches have so far been demonstrated with switching speeds in the microsecond range or the sub microsecond range.

Additionally, in the last few years, there has been an increase in the use of focused ion beam (FIB) milling for micro and nano structure fabrication. The increase is mainly due to the FIB' s ability to mill material with high precision, yielding high-aspect-ratio structures with relatively smooth sidewalls without the use of a mask. Devices such as microfabricated accelerometers, BSCCO stacked junctions, microgratings for integrated optics, and micromilled trenches have already been demonstrated. FIB milled capacitors for micro- and millimeter wave application are also known in the art.

Accordingly, what is needed in the art is an improved MEMS switch having a lower actuation voltage and a faster switching speed in a small form factor.

SUMMARY OF INVENTION

In accordance with the present invention is provided, a microelectromechanical (MEMS) contact switch including a coplanar waveguide having a center conductor for conveying a signal and two conductive ground plane elements. The ground plane elements are positioned on either side of the center conductor and separated therefrom by two air gaps having substantially the same width. The center conductor further includes a suspended metal beam section having an sub-micron angular separation across the metal beam to form an upper suspended cantilever fixed at a first end to the center conductor, and a lower suspended cantilever fixed at a first end to the center conductor, a second end of the upper suspended cantilever and a second end of the lower suspended cantilever adjacent to each other and separated from each other by the sub-micron angular separation and an actuation pad positioned beneath the suspended metal beam section and separated from the suspended metal beam section by an air-gap.

In a particular embodiment, the angular separation between the upper cantilever and the lower cantilever is about 100 nm wide and has an angle of about 52 degrees.

In a specific embodiment, the coplanar waveguide is fabricated on a high-resistivity silicon wafer having a thickness of about 400 μm.

While various configurations are envisioned for the coplanar waveguide, in a specific embodiment, the center conductor is fabricated of chromium and gold and is about 45 μm wide and about 0.44 μm thick, the air-gaps separating the center conductor from the ground plane elements is about 27 μm wide, and the suspended metal beam section of the center conductor has a width of about 60 μm and a length of about 100 μm.

In order to actuate the cantilevers, biasing circuitry is included with the switch which is operation to establish a bias voltage between the actuation pad and the upper suspended cantilever such that the upper cantilever is pulled down to make contact with the lower cantilever. Additionally, the biasing circuitry is operation to establish a bias voltage between the actuation pad and the lower suspended cantilever to further increase the angular separation between the cantilevers.

In accordance with the present invention, a MEMS coplanar waveguide transmission line switching method is provide, the method includes the steps of providing a coplanar waveguide having a center conductor for conveying a signal and two conductive ground plane elements, the ground plane elements positioned on either side of the center conductor and separated therefrom by two air gaps having substantially the same width, the center conductor further comprising a suspended metal beam section having an sub-micron angular separation across the metal beam to form an upper suspended cantilever fixed at a first end to the center conductor, and a lower suspended cantilever fixed at a first end to the center conductor, a second end of the upper suspended cantilever and a second end of the lower suspended cantilever adjacent to each other and separated from each other by the sub-micron angular separation and an actuation pad positioned beneath the suspended metal beam section and separated from the suspended metal beam section by an air-gap and applying a bias voltage between the actuation pad and the upper suspended cantilever to bring the upper cantilever in contact with the lower cantilever to close the switch.

In an additional embodiment, a bias voltage can be applied between the actuation pad and the lower suspended cantilever to further increase the separation between the upper cantilever and the lower cantilever.

While various fabrication methods are within the scope of the present invention, in a particular embodiment a method of fabricating a microelectromechanical (MEMS) contact switch in accordance with the present invention includes fabricating an actuation pad on a high-resistivity silicon wafer, fabricating a coplanar waveguide onto the silicon wafer, the coplanar waveguide having a center conductor for conveying a signal and two conductive ground plane elements, the ground plane elements positioned on either side of the center conductor and separated therefrom by two air gaps having substantially the same width, the center conductor further comprising a suspended metal beam section, the suspended metal beam section positioned to be suspended above the actuation pad and separated from the actuation pad by an air-gap and forming a sub-micron angular separation across the metal beam section resulting in an upper suspended cantilever fixed at a first end to the center conductor, and a lower suspended cantilever fixed at a first end to the center conductor, a second end of the upper suspended cantilever and a second end of the lower suspended cantilever adjacent to each other and separated from each other by the sub-micron angular separation.

The actuation pad may be fabricated onto the silicon wafer by depositing a layer of SiCr onto the silicon wafer and then depositing a nitride layer over the SiCr layer to form the actuation pad. In a particular embodiment, the SiCr layer is about 0.1 μm thick and is deposited using E-beam deposition and the nitride layer is about 0.1 μm thick and is deposited using plasma enhanced chemical vapor deposition.

The fabrication of the coplanar waveguide may be accomplished utilizing using electron beam deposition. In a particular embodiment center conductor and the ground plane elements of the coplanar waveguide are about 0.4 μm thick.

In accordance with the present invention, the sub-micron angular separation across the metal beam section is formed by spinning a layer of polymethyl methacrylate (PMMA) onto the coplanar waveguide, applying a conductive layer over the PMMA layer, milling the sub-micron angular separation utilizing a focused ion beam and then removing the PMMA and conductive layer utilizing a photoresist stripper. In a particular embodiment, the layer of PMMA is about 0.2 μm thick and the conductive layer is about 50 angstroms thick. In a specific embodiment, the focused ion beam is a dual beam focused ion beam set to about 30 keV with a current of about 10 pA.

The nanometer-scale electromechanical systems (NEMS) switch in accordance with the present invention can be actuated with less than about 3V, has sub-microsecond switching speed, and is ~50 times smaller than a MEMS design. Such advantages will reduce the cost of integrating electro-mechanical switches into microwave systems and enable them to be used in a much wider variety of systems.

In accordance with an embodiment of the present invention, nano-scale fabrication techniques have been used to create a sub-micron wide gap across the center conductor of a coplanar waveguide transmission line configured in a fixed-fixed beam arrangement, resulting in a pair of opposing cantilever beams that comprise an electro-mechanical switch. Using a processing technique which leaves a small overlap between the two opposing beams, the switch can be actuated (e.g. electro-statically) to bring the beams into contact and allow signal transmission. When the switch is not actuated, a very small capacitance is present across the gap such that high off-state isolation is achieved. Since the actuation distance is well below 1 micron, the required actuation voltage is small (less than ~3V) and the time required for actuation is correspondingly very short. The beams are actuated using high-resistance electrodes which are located beneath the beams and separated by an air-gap on the order of 1 micron-thick.

Accordingly, a nanometer-scale mechanical switch with very high switching speed and low actuation voltage has been developed. This switch has application in the RF/microwave/wireless industry.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

The present invention illustrates the use of nano-fabricated capacitive gaps in micro-electro-mechanical-systems (MEMS) devices. By applying the fabrication technique to suspended structures, MEMS structures such as switches and varactors are fabricated for applications in the high mm-wave frequency band. The ability to produce angle-cuts, which result in overlapping metal sections, can also find use in microwave frequency switches.

Figure 1:
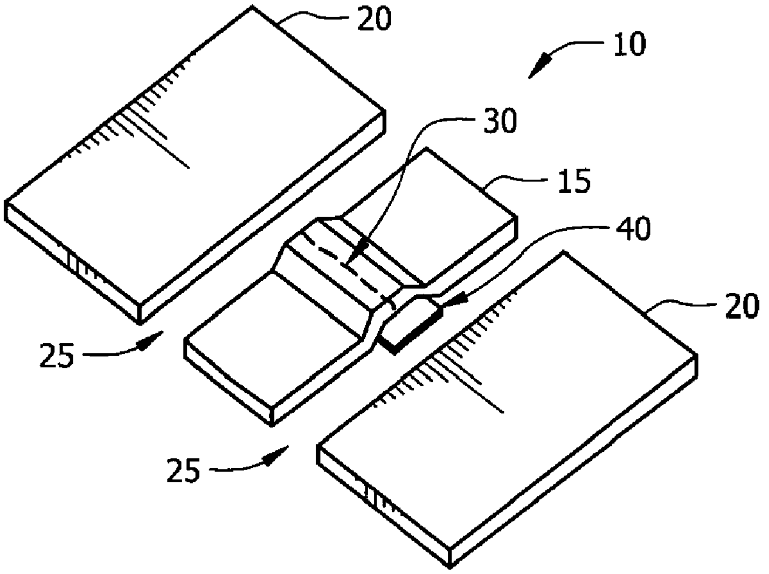
FIG. 1 is a diagrammatic view of a MEMS series switch in accordance with the present invention.

With reference to FIG. 1, a MEMS switch 10 is illustrated in which the milling capabilities of an FIB system have been utilized to cut a submicron wide gap across the conductors of coplanar waveguide (CPW) transmission lines. In accordance with the present invention, a coplanar waveguide in provided in which a dielectric substrate supports three coplanar conductors: a center conductor 15 conveying the signal plus two conductive ground plane elements 20, positioned on either side of the center conductor 15 and separated therefrom by two air gaps 25 having substantially the same width. The center conductor 15 is fabricated to include a suspended membrane section 35. An actuation pad 40 is positioned in underlying relation to the suspended membrane. An angle cut 30 is made using the FIB milling tool in the center of a suspended membrane 35 fixed at both ends to the center conductor 15 of a CPW transmission line. The fabrication of the CPW switch results in two cantilevers which overlap each other in the un-actuated state. When a bias is applied to the upper cantilever, the resulting metal-to-metal contact provides signal transmission. The RF characteristics of the switches were measured from 1 to 23 GHz in the actuated and un-actuated states. An insertion loss of less than 1 dB and isolation greater than 20 dB was obtained.

Figure 2:
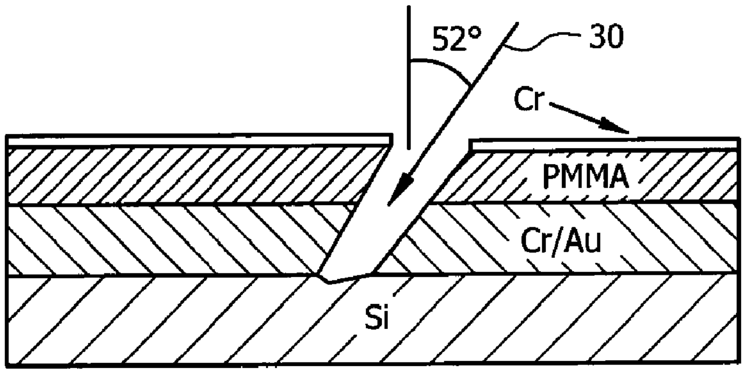
FIG. 2 is a cross sectional view of a focused ion beam (FIB) cut in accordance with the present invention. Top view illustrates a straight cut and bottom shows the cut at a 52° angle.

Milling with an FIB system is achieved by focusing a beam of ions down to a submicron area. This beam is accelerated to a high voltage, generally between 5 and 50 KeV, and interacts in a well-defined area within the target material. The ion beam is produced from the field ionization of a gallium metal that is coated on a needle tip, usually made of tungsten or platinum, with a radius in the sub micron range. The ionized field (>$10^8$ V/cm) is created by a high electric field at the needle tip. The ion beam can then be focused to a beam diameter ranging from less than 5 nm up to half a micron by changing the beam current density. This is accomplished by controlling the strength of the electrostatic lenses and adjusting the effective aperture sizes. Material removal in the focused area can be precisely controlled and viewed since the accelerated ions will generate secondary electrons and ions which can be detected much in the same way as in a scanning electron microscope system. Exact etch patterns and depths can be specified in many computer controlled FIB systems. An exemplary angular separation formed utilizing an FIB system is illustrated in FIG. 2. The angle cut 30 is shown at a 52 degree angle through the PMMA and Cr/Au layers and down to the silicon substrate.

Figure 3:
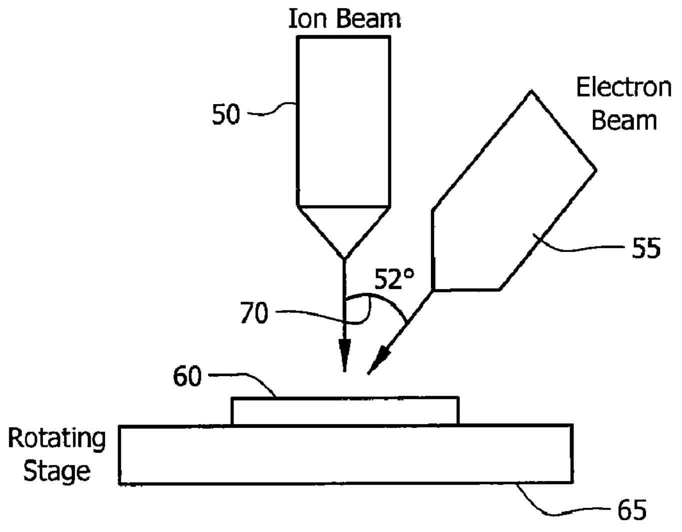
FIG. 3 is a diagrammatic view of a dual ion and electron beam FIB milling system in accordance with the present invention.

Many new FIB systems have dual ion 50 and electron beam 55 columns to provide the capability of taking high resolution scanning electron microscope (SEM) images. With reference to FIG. 3, in a particular embodiment the ion beam 50 and the electron beam 55 are offset by 52° 70. The sample 60 can then be rotated on a rotating stage 65 between the two columns, which allows for FIB milling at angles up to 52°. A cross section view of the cut through the layers is shown with reference to FIG. 4. A 52° angle 70 with respect to the top surface of the center conductor 15 is illustrated.

Figure 4:
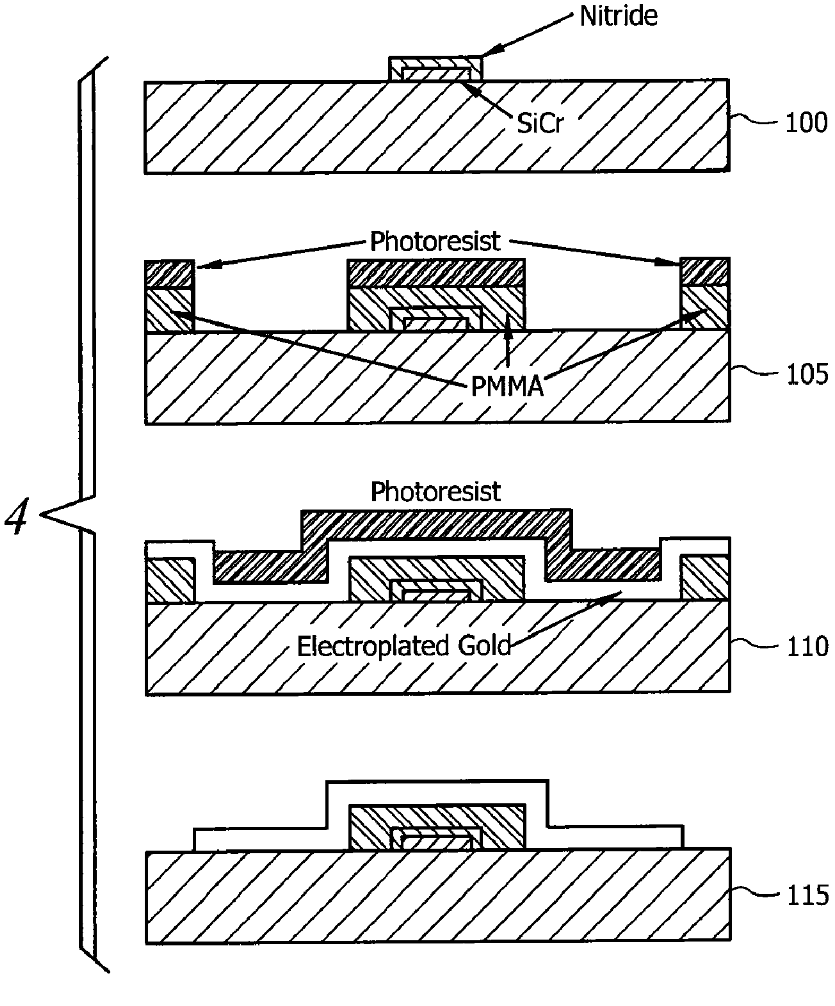
FIG. 4 is a flow diagram illustrating the fabrication process of the suspended cantilever before FIB milling in accordance with the present invention.

A flow diagram of the fabrication process in accordance with the present invention is illustrated with reference to FIG. 4. In accordance with this particular embodiment, devices are fabricated on 400 μm-thick, high-resistivity silicon wafers (ρ>2000 Ohm-cm). The CPW dimensions used were 45 μm for the center conductor width (S) with 27 μm wide conductor to ground gaps (W). The suspended portion of the center conductor has a width of 60 μm and length of 100 μm. FIG. 4 summarizes the fabrication process of the MEMS cantilevers. First a 0.1 μm thick SiCr layer is fabricated using E-beam deposition and lift-off technique followed by a 0.1 μm thick PECVD nitride layer to isolate the SiCr from the cantilevers in case of over actuation 100. Next a 1.5 μm thick PMMA, which acts as the sacrificial layer, is spun on the sample, patterned and etched to define the CPW transmission geometry 105. Then a seed layer of Ti/Au is deposited on the PMMA and the open areas for gold electroplating of the metal lines. After masking with photoresist, the metal lines are electroplated to a thickness of 1.1 μm 110. After the seed layer was removed, the sacrificial layer is dissolved in photoresist remover and the sample is taken through a critical point drying process to finish the release of the actuated structures 115.

In an additional embodiment, a conductive coating (50 Å of Cr) is applied over the PMMA layer which is needed to eliminate electron charging during the FIB milling process. The addition of the PMMA layer also has the beneficial effect of creating narrower cuts in the transmission lines since the focused ion beam generally tapers down to a point during milling. In a specific embodiment, the suspended CPW lines are milled using a FEI DB235 dual beam FIB system. A 30 keV ion beam is used with a set current of 10 pA to mill the gaps. The etch depth is set to 0.6 μm, corresponding to the total metal and PMMA layer thickness. For the angled cut, an etch depth of 0.9 μm is selected which takes about 5 minutes to complete. The angle cut is made slightly longer than the 45 μm wide center conductor to ensure a complete cut over the entire width. After milling, the Cr and PMMA layers are removed by placing the sample in a heated (80° C.) Microposit 1165 photoresist stripper.

Figure 5:
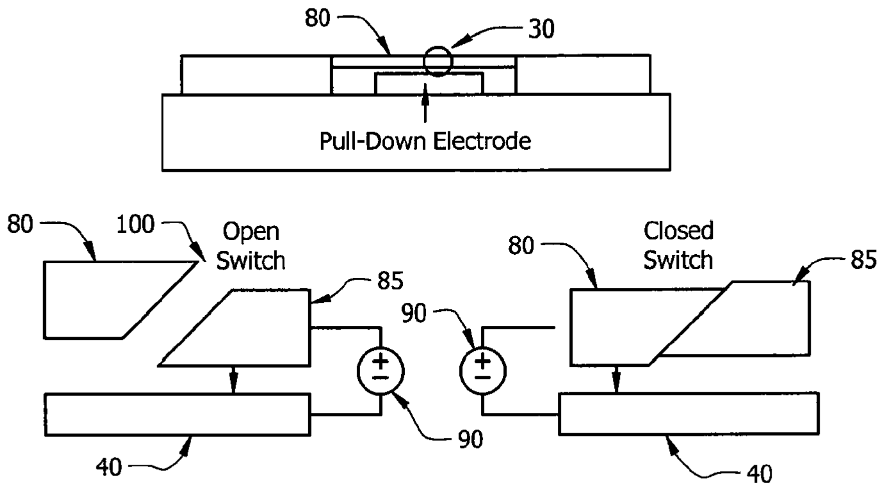
FIG. 5 is a diagrammatic cross-sectional view of the switch and biasing network of the switch in accordance with the present invention.

MEMS switches in accordance with the present invention are based on a CPW series metal-to-metal contact configuration. Milling the suspended section of the center conductor at an angle results in two overlapping cantilevers that can be actuated independently, as illustrated with reference to FIG. 5. As shown in FIG. 5, applying a bias voltage 90 to the upper cantilever 80 pulls down the upper cantilever 80 to touch the lower 85 cantilever, thereby closing the switch and resulting in a DC contact between the electrodes. If a bias voltage 90 is applied beneath the lower cantilever 85, the gap 100 can be increased to improve the isolation of the nanoscale gap 100.

In accordance with the specific embodiment of the invention, measurements were then performed from 1 to 23 GHz on a Karl Suss probe station with a Wiltron 360 vector network analyzer (VNA). 150 μm pitch 3 prong probes were used to measure the devices and the TRL on wafer calibration standards. A bias was applied between the SiCr line and through the RF probes at each port. Bias tees were used at the port inputs to isolate the RF signal form the DC bias. FIG. 5 through FIG. 8 shows measured to modeled data S11 and S21 comparisons.

Figure 6:
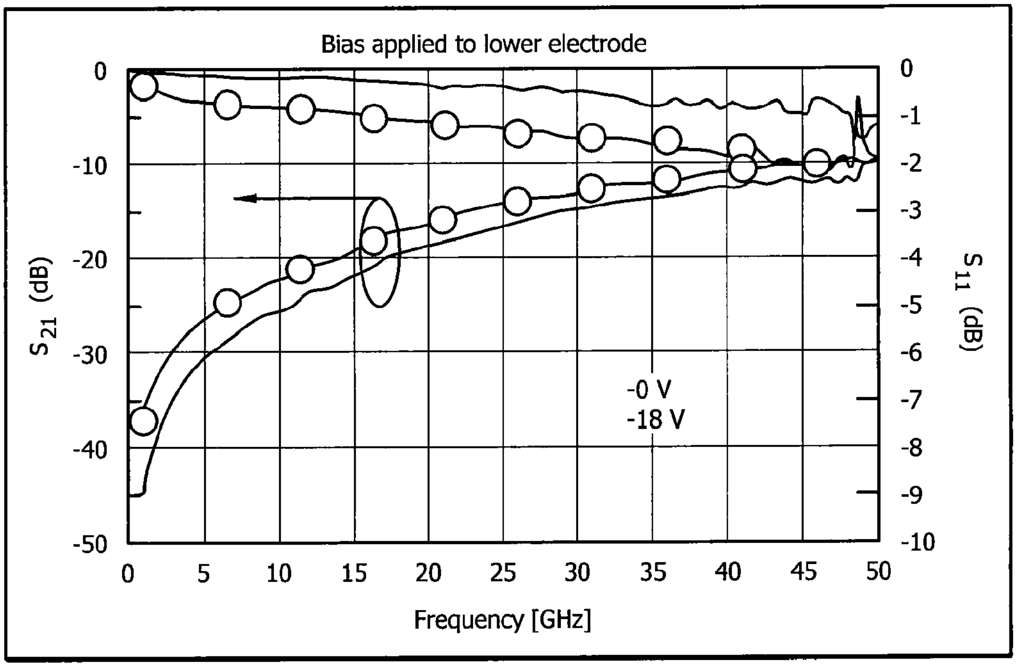
FIG. 6 illustrates a comparison of S-parameters between measured and modeled data for the switch in accordance with the present invention in which the switch is open with no bias applied and a bias is applied to the lower cantilever (i.e. electrode).
Figure 7:
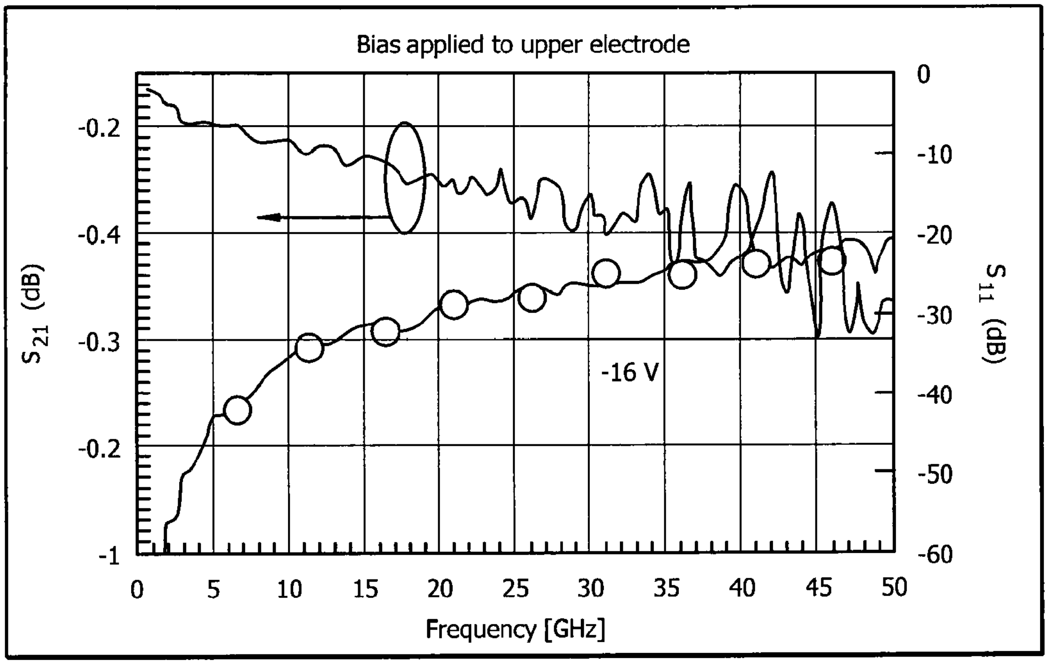
FIG. 7 illustrates a comparison of S-parameters between measured and modeled data for the switch in accordance with the present invention in which the switch is open with no bias applied and a bias is applied to the upper cantilever (i.e. electrode).
Figure 8:
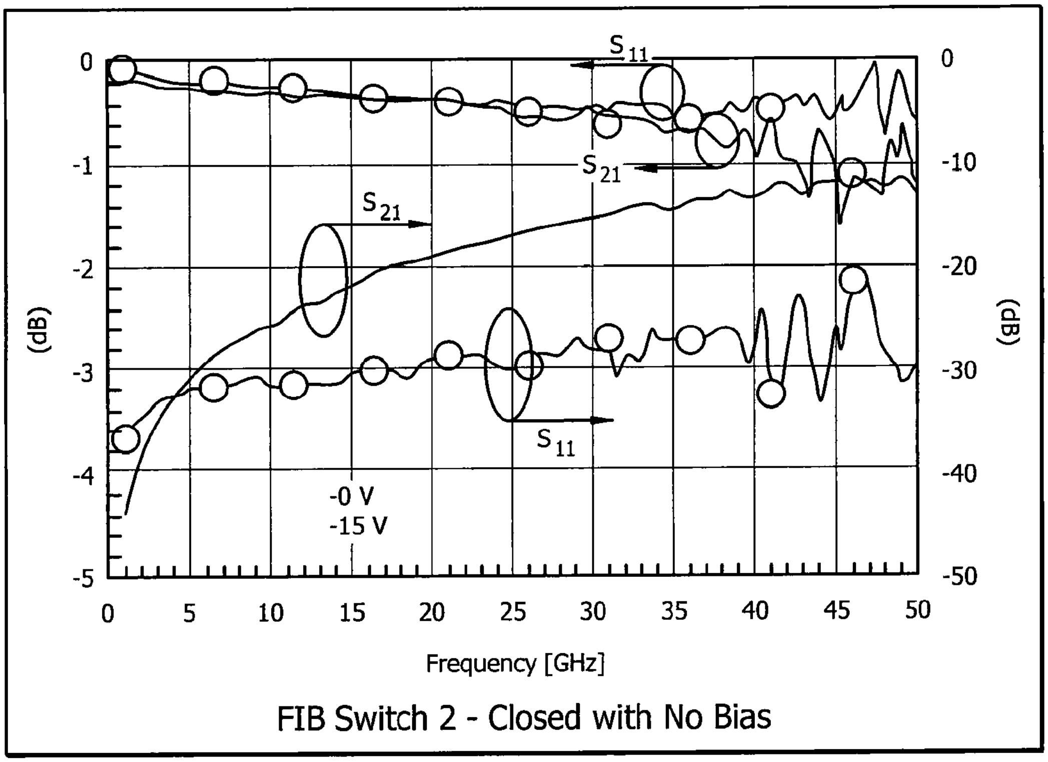
FIG. 8 illustrates a comparison of S-parameters between measured and modeled data for the switch in accordance with the present invention in which the switch is closed with no bias applied.
Figure 9:
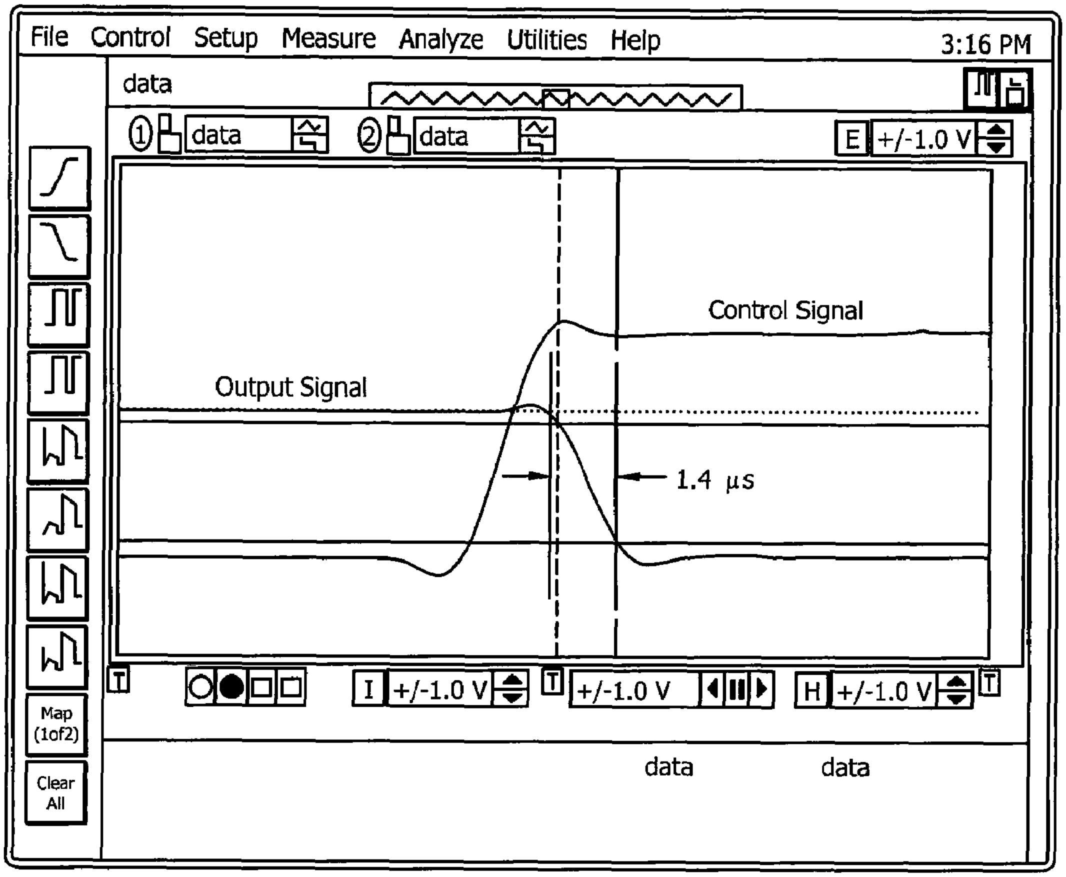
FIG. 9 illustrates the rise time of a switch going from an unactuated to an actuated state in accordance with the present invention in which the switch is open with no bias applied.
Figure 10:
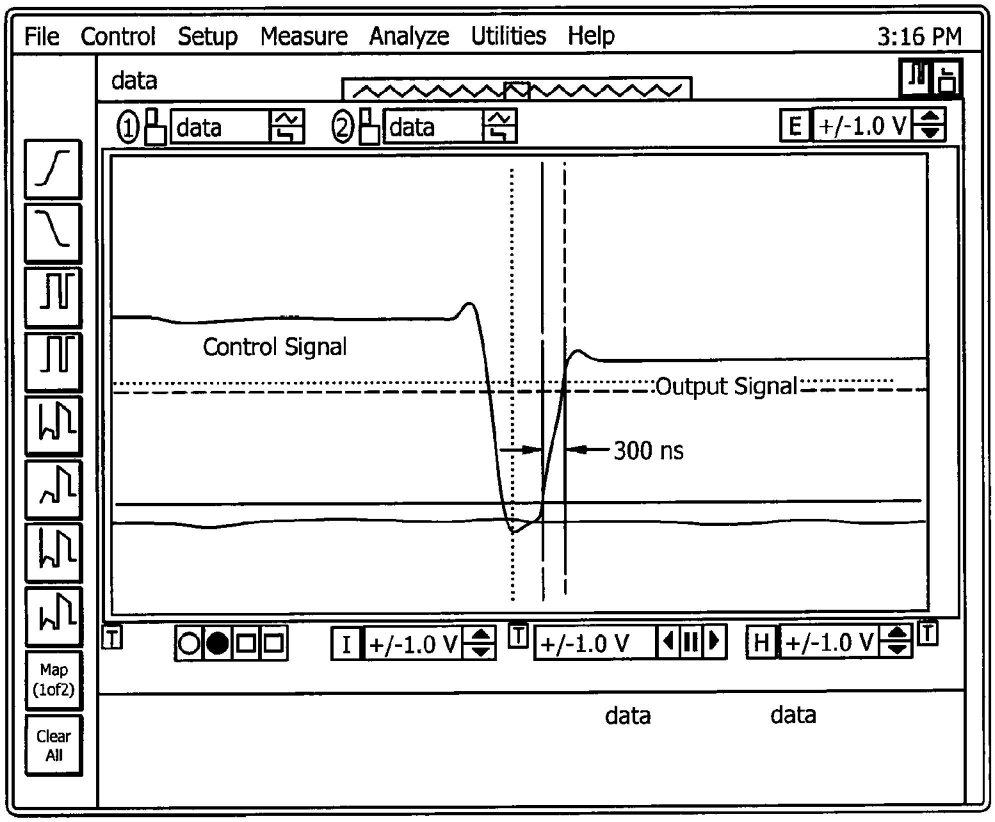
FIG. 10 illustrates the fall time of a switch going from an actuated to an unactuated state in accordance with the present invention in which the switch is open with no vias applied.
Figure 11:
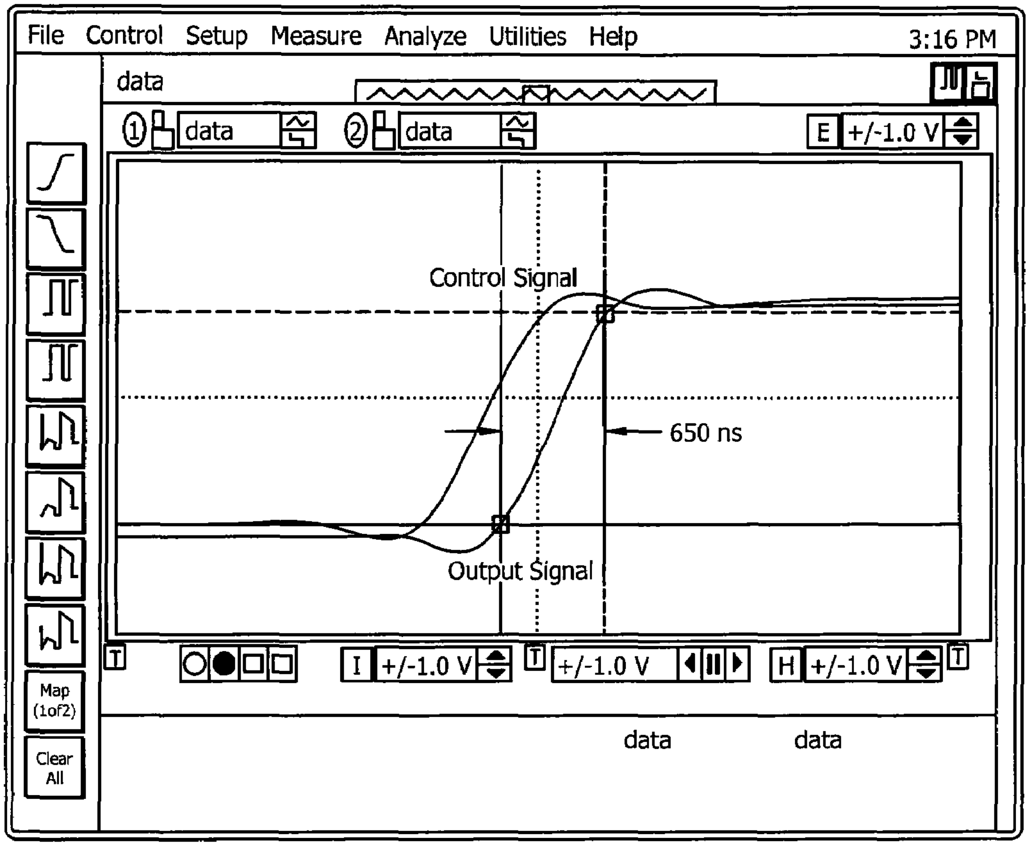
FIG. 11 illustrates the fall time of a switch going from an actuated to an unactuated state in accordance with the present invention in which the switch is closed with no vias applied.
Figure 12:
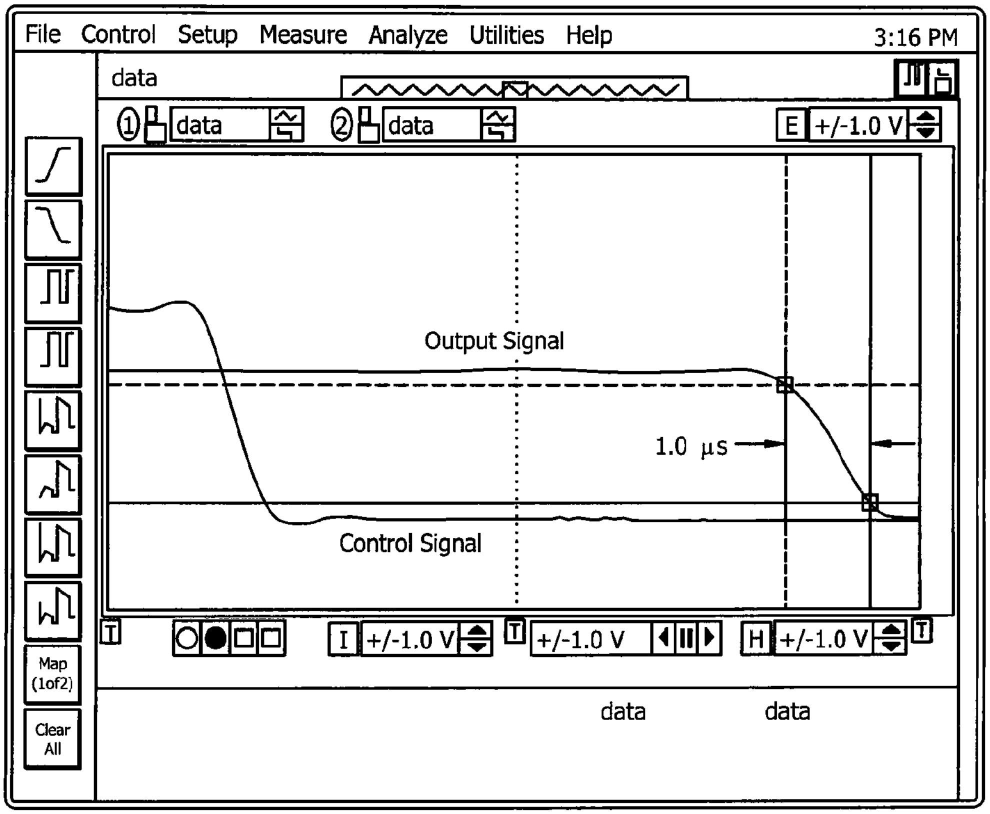
FIG. 12 illustrates the rise time of a switch going from an unactuated to an actuated state in accordance with the present invention in which the switch is closed with no vias applied.

FIG. 6 illustrates a comparison of S-parameters between measured and modeled data for the switch in accordance with the present invention in which the switch is open with no bias applied and a bias is applied to the lower cantilever (i.e. electrode). FIG. 7 illustrates a comparison of S-parameters between measured and modeled data for the switch in accordance with the present invention in which the switch is open with no bias applied and a bias is applied to the upper cantilever (i.e. electrode). FIG. 8 illustrates a comparison of S-parameters between measured and modeled data for the switch in accordance with the present invention in which the switch is closed with no bias applied. FIG. 9 illustrates the rise time of a switch going from an unactuated to an actuated state in accordance with the present invention in which the switch is open with no bias applied. FIG. 10 illustrates the fall time of a switch going from an actuated to an unactuated state in accordance with the present invention in which the switch is open with no vias applied. FIG. 11 illustrates the fall time of a switch going from an actuated to an unactuated state in accordance with the present invention in which the switch is closed with no vias applied. FIG. 12 illustrates the rise time of a switch going from an unactuated to an actuated state in accordance with the present invention in which the switch is closed with no vias applied.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed is:

1. A method of fabricating a microelectromechanical (MEMS) contact switch, the method comprising the steps of:

fabricating an actuation pad on a high-resistivity silicon wafer;

fabricating a coplanar waveguide onto the silicon wafer, the coplanar waveguide having a center conductor for conveying a signal and two conductive ground plane elements, the ground plane elements positioned on either side of the center conductor and separated therefrom by two air gaps having substantially the same width, the center conductor further comprising a suspended metal beam section, the suspended metal beam section positioned to be suspended above the actuation pad and separated from the actuation pad by an air-gap;

forming a sub-micron angular separation across the metal beam section resulting in an upper suspended cantilever fixed at a first end to the center conductor, and a lower suspended cantilever fixed at a first end to the center conductor, a second end of the upper suspended cantilever and a second end of the lower suspended cantilever adjacent to each other and separated from each other by the sub-micron angular separation.

2. The method of claim 1, wherein the step of fabricating an actuation pad on a high-resistivity silicon wafer, further comprises the steps of:

depositing a layer of SiCr onto the silicon wafer; and depositing a nitride layer over the SiCr layer to form the actuation pad.

3. The method of claim 2, wherein the SiCr layer is about 0.1 μm thick and is deposited using E-beam deposition.

4. The method of claim 2, wherein the nitride layer is about 0.1 μm thick and is deposited using plasma enhanced chemical vapor deposition.

5. The method of claim 1, wherein the coplanar waveguide is fabricated on the silicon wafer using electron beam deposition.

6. The method of claim 1, wherein the center conductor and the ground plane elements of the coplanar waveguide are about 0.4 μm thick.

7. The method of claim 1, wherein the step of forming a sub-micron angular separation across the metal beam section further comprises the steps of:

spinning a layer of polymethl methacrylate (PMMA) onto the coplanar waveguide;

applying a conductive layer over the PMMA layer;

milling the sub-micron angular separation utilizing a focused ion beam; and removing the PMMA and conductive layer utilizing a photoresist stripper.

8. The method of claim 7, wherein the layer of PMMA is about 0.2 μm thick.

9. The method of claim 7, wherein the conductive layer is about 50 angstroms thick.

10. The method of claim 7, wherein the focused ion beam is a dual beam focused ion beam set to about 30 keV with a current of about 10 pA.

* * * * *